United States Patent [19]
Chen et al.

[11] Patent Number: 5,879,988
[45] Date of Patent: Mar. 9, 1999

[54] CAPACITOR OF A DRAM CELL AND METHOD OF MAKING SAME

[75] Inventors: Kuang-Chad Chen; Tuby Tu, both of Hsin-Chu, Taiwan

[73] Assignee: Mosel Vitelic Incorporated, Hsin-Chun, Taiwan

[21] Appl. No.: 661,912

[22] Filed: Jun. 12, 1996

[51] Int. Cl.⁶ .............................................. H01L 21/8242
[52] U.S. Cl. ............................................ 438/254; 438/397
[58] Field of Search .................................. 438/253, 254, 438/396, 397

[56] References Cited

U.S. PATENT DOCUMENTS

| | | | |
|---|---|---|---|
| 5,049,517 | 9/1991 | Lui et al. | 438/254 |
| 5,071,783 | 12/1991 | Taguchi et al. | 438/254 |
| 5,286,668 | 2/1994 | Chou | 438/254 |
| 5,422,295 | 6/1995 | Choi | 438/254 |
| 5,622,882 | 4/1997 | Yee | 438/397 |
| 5,661,340 | 8/1997 | Ema et al. | 438/254 |

*Primary Examiner*—Charles L. Bowers, Jr.
*Assistant Examiner*—Toniae M. Thomas
*Attorney, Agent, or Firm*—Bacon & Thomas

[57] ABSTRACT

A stacked capacitor of a DRAM cell has an increased storage electrode without increasing the total area and fabrication complexity of the DRAM cell. By disposing the storage electrode of a memory capacitor on an especially made rugged stacked oxide layer, the area of the storage electrode is enlarged and thus provides the higher capacitance. Then, by removing the rugged stacked oxide layer to expose the rugged surface of the storage electrode, the capacitance of a memory capacitor is additionally increased after covering the whole rugged surface of a of the storage electrode with a dielectric film.

10 Claims, 8 Drawing Sheets

CAPACITOR OF A DRAM CELL AND METHOD OF MAKING SAME

DESCRIPTION OF THE PRIOR ART

Recently, significant progress has been made in the field of semiconductor memory devices. In particular, in the case of a dynamic random access memory (to be referred to as a DRAM hereafter), various attempts have been made to provide a high integration density without degrading storage characteristics of the memory. Referring to FIG. 1, each DRAM cell comprises a single field effect transistor T and a single capacitor C. The field effect transistor T has one conduction terminal connected to the storage electrode of the capacitor C and another conduction terminal connected to a bit line BL. In addition, the field effect transistor T has a gate electrode connected to a word line WL. The capacitor C has its other electrode connected to ground. Many DRAM cells are are arranged in a matrix form to store a large quantity of information. At the time of writing data, since a predetermined pontential is applied to the word line WL so that the field effect transistor T is rendered conductive, a charge from the bit line BL is stored in the capacitor C.

On the other hand, at the time of reading out data, since a predetermined pontential is applied to the word line WL so that the field effect transistor T is rendered conductive, a charge stored in the capacitor is extracted through the bit line BL. Accordingly, information "0"and "1" is represented by electric charge and no charge (or alternatively, no charge and electric charge) on the storage electrode of the memory capacitor. During the reading cycle, the capacitor C also shares a charge with the bit line BL capacitance. The ratio of the two capacitances has to be high enough to ensure that the resultant voltage can be detected by the sense amplifier. Hence, it is expected that the capacitance of the capacitor should be raised as much as possible to improve the signal to noise (S/N) ratio of a DRAM cell while maintaining the same occupation area and complexity of fabrication as that of conventional art.

In general, the capacitor of a DRAM cell includes a storage electrode made up of a polysilicon layer, a plate electrode made up of a polysilicon layer, and a dielectric film made up of a stacked ONO(Oxide-Nitride-Oxide)layer. Although decreasing the thickness of a dielectric film can provide a method for increasing the capacitance of a capacitor, a dielectric film with decreased thickness lacks reliability since the number of defects such as pinholes increases, the yield thereof decreases and, in addition, the electric field strength applied to the dielectric film increases to cause a dielectric breakdown. Therefore, the dielectric film has a limited film thickness and thus enlarging the area of the storage electrode is another method of providing a higher capacitance. However, if the area of a memory capacitor is enlarged, the occupation area of the memory cell will be increased, resulting to a big obstacle in implementation of a highly integrated device with a large memory capacity.

Presently, in order to overcome such problems, a stacked memory capacitor or a trench memory capacitor is often used as a charge storage capacitor of a DRAM cell. For example, a trench memory capacitor is disclosed in U.S. Pat. Nos. 4,859,615 and 5,012,308. By disposing a polysilicon film on a "V" or "U" shaped trench formed on a silicon substrate, a trench memory capacitor raises its capacity without decreasing high packing density. However, the area and the depth of a trench are hard to control when a memory capacitor is further miniaturized, resulting in a serious problem of manufacturing with regard to the yield.

Recently, a DRAM cell having a so called fin-shaped stacked memory capacitor was disclosed in U.S. Pat. Nos. 5,126,810, 5,187,548 and 5,409,896. Compared to a trench memory capacitor, the fabrication of the fin-shaped stacked memory capacitor is more feasible.

Next, a briefly stated description will be given of a method of of producing a DRAM cell with a stacked memory capacitor having a plurality of fin-shaped parts, by referring to FIG. 2 through 9. As shown in FIG. 2, a field effect transistor T includes a source(or drain)region 5, a drain (or source) region 6 formed in the surface of a silicon substrate 1, a gate insulating film 3 such as $SiO_2$ formed on the substrate, and and a gate electrode (that is a word line ) $4_1$ laid over the gate insulating film 3. Meanwhile, a region of field oxide 2 adjacent to a memory capacitor is used to ensure that the cell has a good isolation between the adjacent memory capacitors , which prevents the cell information from being inverted, and is formed by so called "LOCOS", which is a method of a selective thermal oxidation of a silicon surface. Over the region of field oxide 2 is laid another wordline $4_2$ connected to a gate of another cell transistor. Here, we do not specify whether the field effect transistor T is NMOS or PMOS since the two types of devices can each be adopted in a fin-shaped memory capacitor configuration.

Referring to FIG. 3, over the entire surface of a silicon substrate 1, an insulating layer 7 such as phosphosilicate glass (PSG) is deposited by a CVD method and followed by the standard photolithographic process, which involves forming a photoresist layer on the surface of a silicon substrate 1, exposing the photoresist through a mask and developing the photoresist layer. A process of reactive ion etching (RI E) is employed to remove the unnecessary Portion of the insulating layer 7. A gate insulating film 3, in which a bit line contact hole 7A, is connected to the source(or drain) region of the field effect transistor, is formed, and then a pattern of bit lines 12 is formed after depositing a polysilicon layer doped with a high concentration of impurities and then patterned using a photoresist pattern as a mask. Next, referring to FIG. 4, an etching protection layer such as $Si_3N_{413}$ is deposited to preventing the insulating layer 7 from damage due to overetching of subsequently deposited layers. Then, a process of alternatively depositing an oxide layer and a doped polysilicon layer is performed, thereby forming a stacked layer structure of an oxide layer 14, a doped polysilicon layer 15, an oxide layer 16, a doped polysilicon layer 17 and an oxide layer 18 from bottom to top, as shown in FIG. 4. Meanwhile, the doped polysilicon layer 15,17 is made conductive by introducing the high concentration of impurities.

Referring to FIG. 5, a storage electrode contact hole 7B is formed by the standard photolithographic process, etching from the top oxide layer 18 to the surface of the drain(or source)region 6 of the field effect transistor T. A process of depositing a doped polysilicon layer 19 having low resistivity follows, as shown in FIG. 6. Next, after a photolithographic process and an etching from the top doped polysilicon layer 19 to the surface of the lowest oxide layer 14, a memory capacitor pattern is formed, as shown in FIG. 7. Referring to FIG. 8, an etching process for example, using hydrofluoric acid etchant, is employed to remove the oxide layers 14,17,18 and thus a storage electrode having three fin-shaped parts is formed, including the doped polysilicon layer 15,17, and 19. Meanwhile, the gates (i.e. word lines) remain undamaged due to the protection of the etching protection layer 13; otherwise such damage may occur due to the overetching of the insulating layer 7.

Next, referring to FIG. 9, a dielectric film 20 having a thickness of about 100Å A is formed to cover the whole exposed surface of the doped polysilicon layers 15,17,19 by a thermal oxidation carried out in an oxygen ambient or by depositing an ONO (Oxide-Nitride-Oxide) layer using a CVD method. Finally, a doped polysilicon layer 21 is formed to be used as a plate electrode of a memory capacitor and thus the structure of a memory capacitor is completed. Although such a fin-shaped stacked memory capacitor can increase its capacitance, this electric capacity is not high enough to meet the demands of high integration density, for example 10 mega DRAM, so that a need exists to provide a higher capacitance while maintaining the same occupation area of a memory capacitor as that of the conventional art.

SUMMARY OF INVENTION

Therefore, an object of the invention is to provide a method of remarkably increasing the capacitance of a memory capacitor while occupying the same area as that of conventional art.

Another object of the invention is to providing a higher integration density by increasing a capacitance of a memory capacitor having a smaller area, compared to the conventional art.

A method of forming a stacked capacitor according to the invention includes the following steps:

a) a step of forming a field effect transistor and an isolation region of field oxide in the surface of a silicon substrate; wherein the field effect transistor further comprises a gate electrode( i.e. a word line), source/drain regions, and a gate insulating film interposed therebetween.

b) a step of depositing an insulating layer such as Phosphosilicate glass (PSG) and then forming a bit line contact hole 7A, connected to the source (or drain) region of the field effect transistor, after etching the insulating layer and the gate insulating film using a photoresist pattern as a mask.

c) a step of forming a bit line by depositing a doped polysilicon layer and then patterned using a photoresist pattern as a mask.

d) a step of forming an etching protection layer.

e) a step of successively depositing a roughened stacked oxide layer, which comprises a lower layer of PE TEOS and an upper layer of O$_3$/TE OS, a doped polysilicon layer, a roughened stacked oxide layer, a doped polysilicon layer and a roughened stacked oxide layer and thus forming a stacked structure.

f) a step of forming a storage electrode contact hole by etching from the top rugged stacked oxide layer to the surface of the drain (or source)region of the field effect transistor using a photoresist pattern as a mask, and then depositing a doped polysilicon layer.

g) a step of forming a patterned memory capacitor by etching from the top doped polysilicon layer to the surface of the lowest roughened stacked oxide layer using a photoresist pattren as a mask.

h) a step of removing the roughened stacked oxide layers and thus forming a fin-shaped storage electrode of the memory capacitor.

i) a step of forming dielectric layer by a thermal oxidation of a doped polysilicon layer or depositing an insulating film of ONO, and then depositing a doped polysilicon layer as a plate electrode of a memory capacitor so that the memory capacitor is completed

BRIEF DESCRIPTION OF THE DRAWINGS

The invention itself, however, as well as other features and advantages thereof, will be best understood by reference to the detailed description which follows, read in conjunction with the accompanying drawings, wherein.

DETAILED DESCRIPTION OF THE PREFERRED EMBODIMENT

The method of the present invention is based on a sequence of steps involving depositing an oxide layer by a plasma-enhanced chemical vapor deposition (PECVD) method and then depositing an oxide layer by a method of O$_3$/TEOS, in which the O$_3$ gas is introduced to the vapor of a tetraethoxysilicate (abbreviated TEOS) solution and silicon dioxide is obtained after their chemical reactions. In this specification, the terms of "O$_3$/TEOS" or "TEOS" refers to the final product of oxide layers rather than their forming methods. As a result of the basic sequence the surface of the O$_3$/TEOS layer is constituted by many island structures, which can be proven by scaning electron microscopic (SEM) photography. The presence of the island structure contributes to increasing the area of a storage electrode if a polysilicon layer is deposited on the O$_3$/TEOS layer since the growing of the polysilicon layer follows the topography of the O$_3$/TEOS. Meanwhile, it is noted that beneath the O$_3$/TEOS is the PE TEOS layer so that roughening of the surface of the O$_3$/TEOS only occurs when it has a base layer of PE TE OS and that these two oxide layers constitute a so called "roughened stacked oxide layer" in this specification.

Figure 10:
FIG. 10 is an SEM picture of a conventional oxide layer and a polysilicon layer thereon.
Figure 11:
FIG. 11 is an SEM picture of a roughened stacked oxide layer and a polysilicon layer thereon, according to the present invention.

FIG. 11 is an SEM photograph of the stacked structure of a roughened stacked oxide layer and a polysilicon layer thereon, the surface of the polysilicon layer, positioned in the top layer of FIG. 11, is much more corrugated than that of the conventional stacked structure of an oxide layer and a polysilicon layer thereon, shown in FIG. 10 (it is noted that these two photographies have the same magnification). Besides, the same result can be obtained in the interface between the polysilicon layer and the O$_3$/TEOS, which can further enlarge the area of the storage electrode by removing the roughened stacked oxide layer, thus exposing the bottom surface of the storage electrode.

The roughened stacked oxide layer is also can be formed by the following method which includes: 1. depositing O$_3$/TEOS on a thermal oxide; 2. depositing O$_3$/TEOS on a PSG layer formed by the TEOS method; 3. depositing O$_3$/TEOS on a nitride layer formed by LPCVD or PECVD. Meanwhile, the best growing conditions of the roughened stacked oxide layer comprise a growing temperature of 300°–500° C., a presure of 200–760 Torr, and the ratio of the flowing rate of O$_3$ to TEOS being larger than 8.

THE FIRST PREFERRED EMBODIMENT

Most of the steps of manufacturing a stacked memory capacitor with a storage electrode having a plurality of fin-shaped parts according to the invention are the same as that of the conventional art, except for the following steps. More specifically, the oxide layers 14,16,18 shown in the FIGS. 4, 5, 6, and 7, are replaced by the roughened stacked oxide layer. Also, since a short duration HF dip is employed to remove the particles and contamination, a step of annealing is necessary to densify the roughened stacked oxide layer for lowering the etching rate of the $O_3$/TEOS layer during HF etching, and thus the island structures of the surface of the rugged stacked oxide layer remain.

Figure 1:
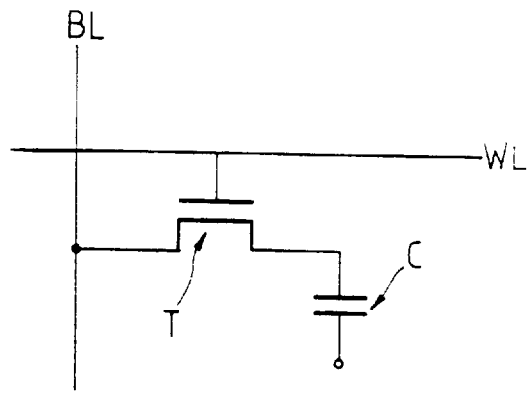
FIG. 1 is a circuit diagram of a DRAM cell.
Figure 2:
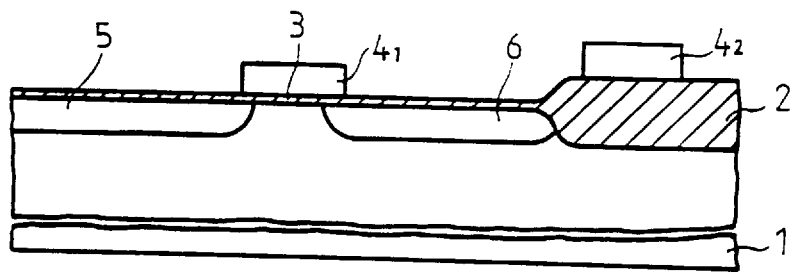
FIGS. 2–9 are cross-sectional views showing sequential the steps of the processes for manufacturing conventional fin-shaped stacked memory capacitors.
Figure 3:
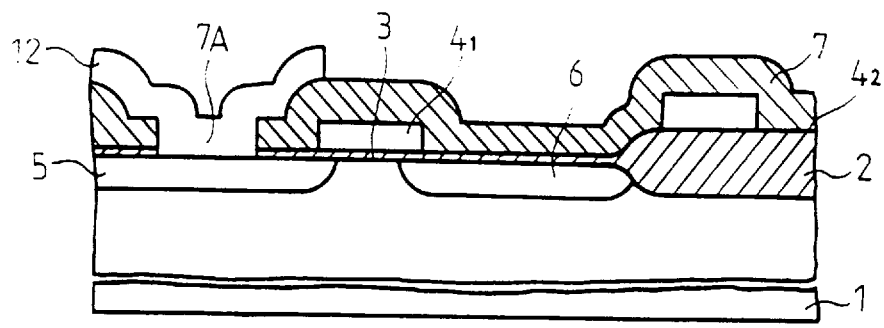
Figure 4:
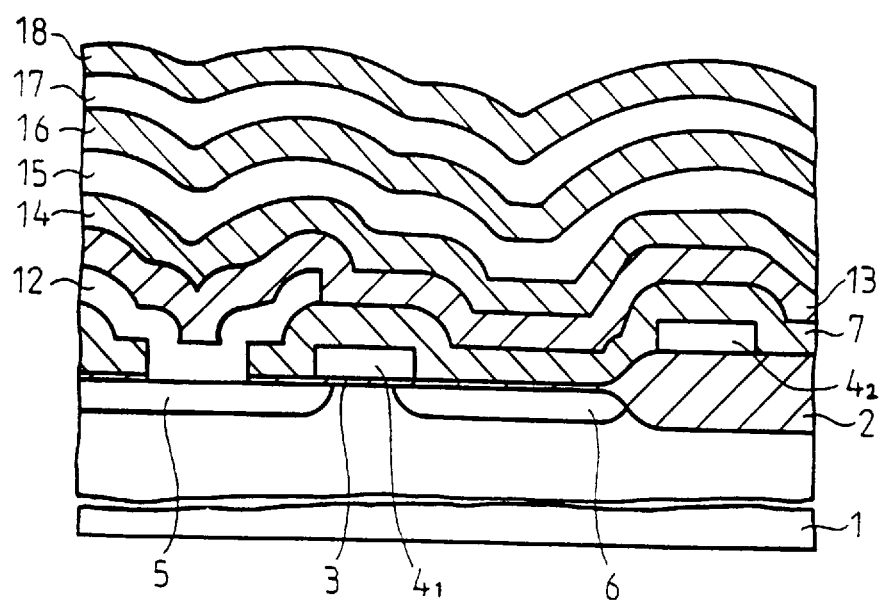
Figure 5:
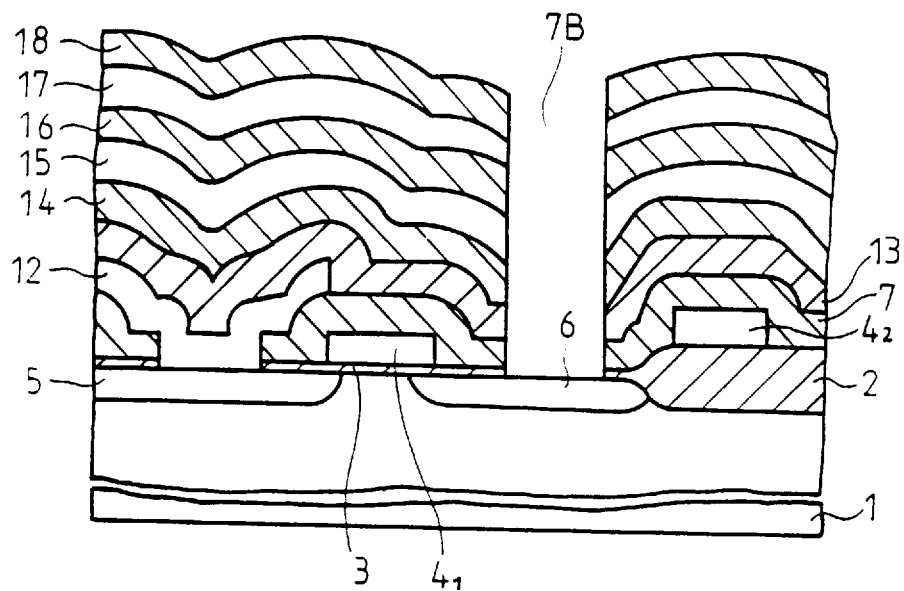
Figure 6:
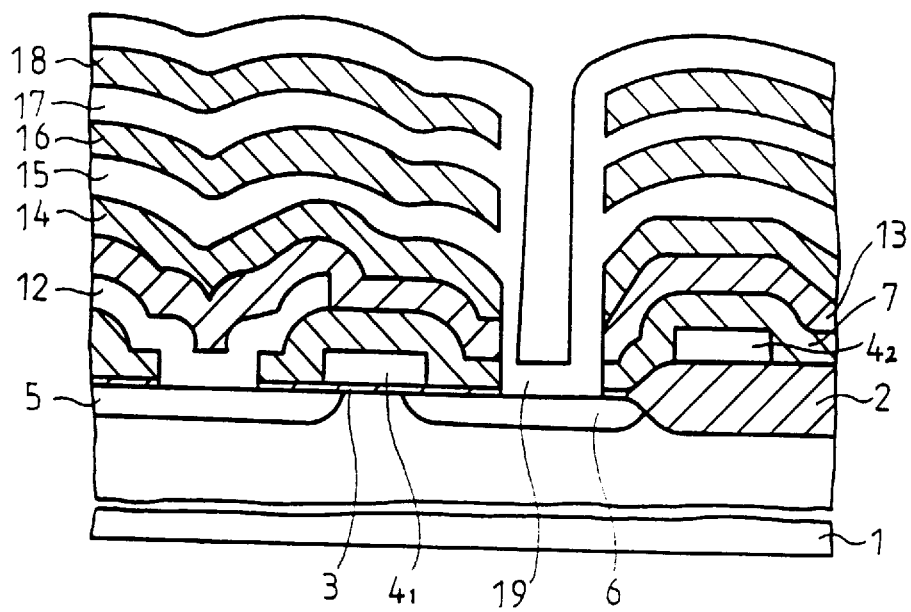
Figure 7:
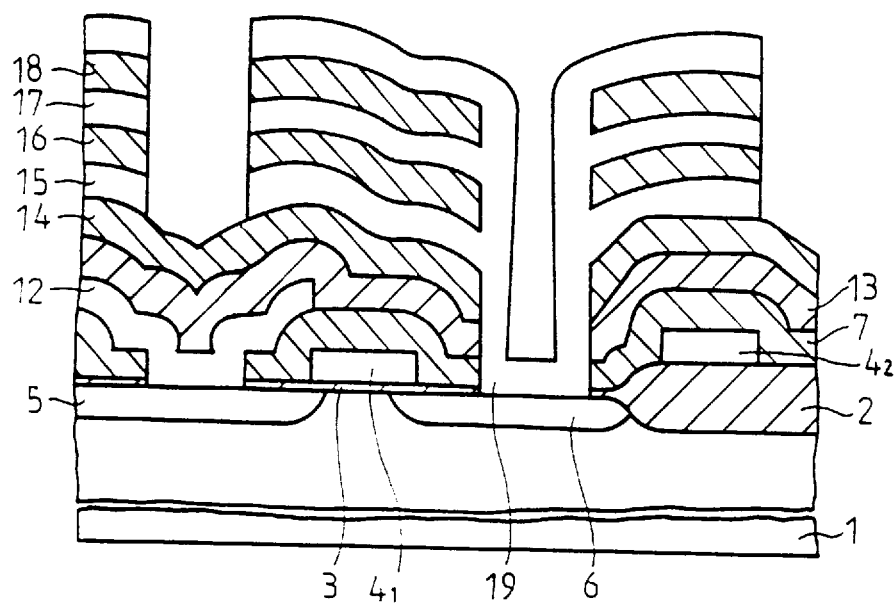
Figure 8:
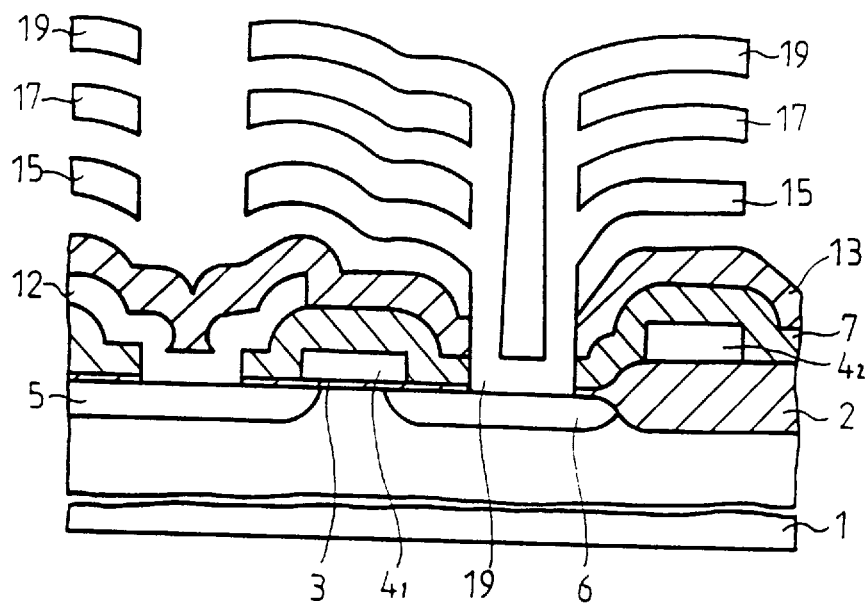
Figure 9:
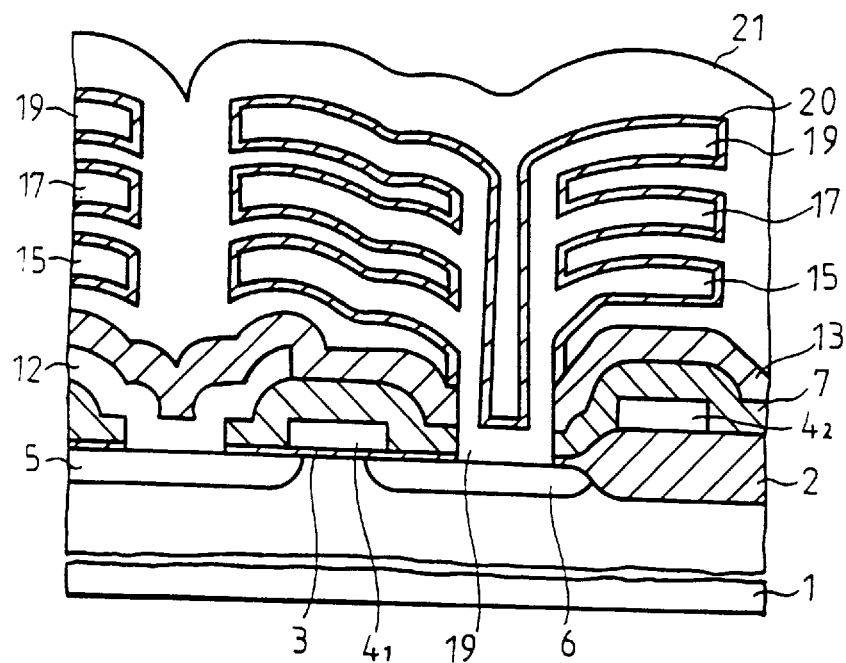
Figure 14:
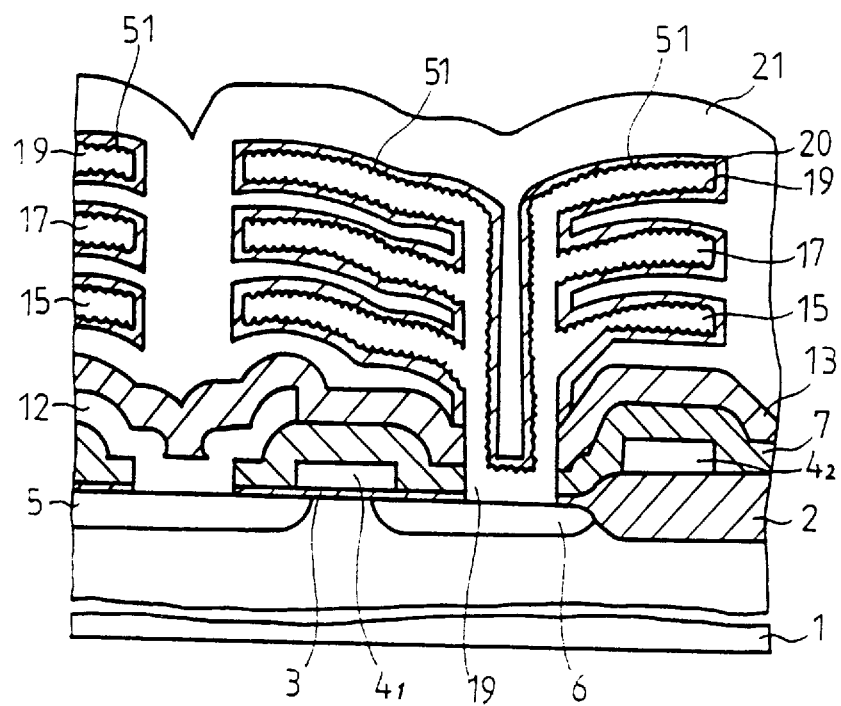
FIG. 14 is a cross-sectional view of a completed three fin stacked memory capacitor according to the invention.

As is apparent in FIG. 14, which shows a completed three fin stacked capacitor according to the invention it is obvious that the storage electrode, consituted by three fin-shaped doped polysilicon layers 15,17,19, has a much more corrugated surface 51 on its top and bottom surface than that of conventional art, shown in the FIG. 9.

THE SECOND EMBODIMENT

Figure 12:
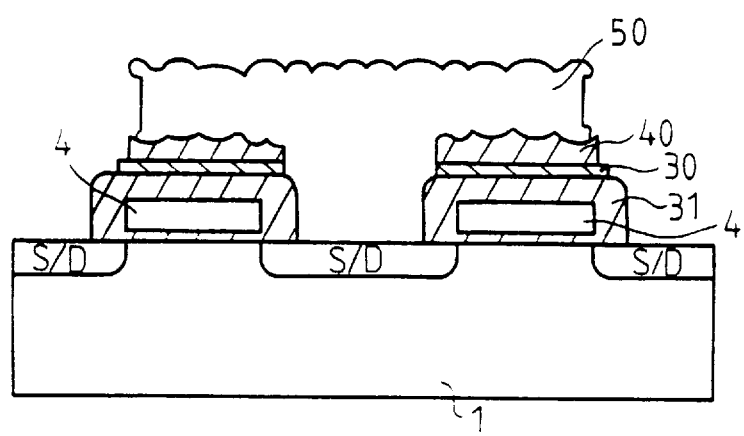
FIG. 12 is a cross-sectional view showing the formation of a storage electrode of a one fin stacked memory capacitor accorrding to the invention.
Figure 13:
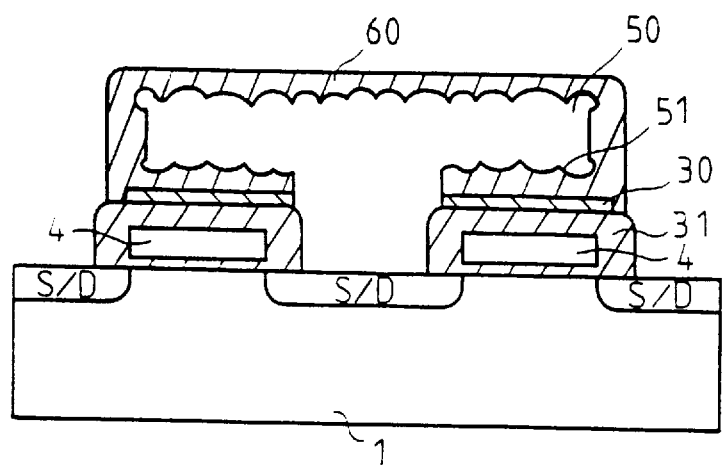
FIG. 13 is a cross-sectional view of a completed one fin stacked memory capacitor according to the invention.

Although the steps involved in forming a stacked memory capacitor with a storage electrode of one fin-shaped part according to the second preferred embodiment of the invention are much simpler than those of the first preferred embodiment, a description of the processes for manufacturing the one fin-shaped part of the stacked memory capacitor will be made hereinafter. Referring to the FIG. 12, a field effect transistor, composed of a gate electrode 4, source/drain (S/D) regions and a gate insulating film such as $SiO_2$ interposed therebetween, and a field oxide are formed in the surface of a silicon substrate 1 Next, an insulating layer 31, for example such as PSG, is deposited and a bit line contact hole is then formed by etching the insulating layer and the gate insulating film. Thereafter, a doped polysilicon layer is deposited and then patterned using a patterned phtorsist as a mask to form a bit line connected to the source region of the field effect transistor. Over the exposed surface of the silicon substrate 1 is deposited an etching protection layer 30 such as $Si_3N_4$.

Subsequently, a process of forming a roughened stacked oxide layer 40, which comprises a lower layer of PE TEOS and an upper layer of $O_3$/TEOS, follows and then the whole wafer is subjected to an annealing to densify the roughened stacked oxide layer so that its corrugated surface is not damaged by the HF etchant, a necessary process prior to a deposition of a polysilicon layer to ensure cleanliness of the wafer.

Subsequently, a storage electrode contact hole, connected to the drain (or source) region of the field effect transistor, is formed after the standard photolithographic processes and etching the rugged stacked oxide layer 40, the $Si_3N_4$ 30 layer, and the insulating layer 31. Next, a layer of doped polysilicon is deposited and patterned to form a storage electrode 50 of a memory capacitor using a photoresist pattern as a mask. As described in the foregoing, the step of annealing is necessary to densify the roughened stacked oxide layer and thus its corrugated surface can be protected. Then, the bottom corrugated surface is exposed after removing the roughened stacked oxide layer and followed by a process of thermal oxidation, or depositing an ONO layer, to form a dielectric film 60 of a memory capacitor. At last, a doped polysilicon layer is deposited and thus a whole memory capacitor is completed. As a result, several features that the conventional art can not achieve are obtained as follows:

1) Since the storage electrode formed on the roughened stacked oxide layer has a corrugated surface, the area of the storage electrode can be enlarged and the capacitance of the memory capacitor is increased thereby.

2) According to the invemtion, the holding characteristics of the memory capacitor are more reliable than that of the conventional art since the electric capacity is increased.

3) Compared to the conventional art, the invention has a higher capacitance while maintaining the same occupation area of a memory capacitor as that of the conventional art, thereby providing a higher integration density. Meanwhile, the complexity of fabrication is not increased, compared to the conventional art, and thus the processes of the invention are easily adapted to mass production.

Although the preferred embodiment of the invention has been disclosed for illustrative purposes, those skilled in the art will appreciate that various modifications, additions and substitutions are possible, without departing from the scope and spirit of the invention, as recited in the accompanying claims.

What is claimed is:

1. A method of fabricating a fin-shaped stacked memory capacitor of a DRAM cell, comprising the steps of:

a) forming a field effect transistor and an isolation region of field oxide in the surface of a silicon substrate, in which the field effect transistor further comprises a gate electrode, source and drain regions, and a gate insulating film interposed therebetween;

b) depositing an insulating layer on the resulting layer formed in step a) and then forming a bit line contact hole, connected to the source or drain region of the field effect transistor, by etching the insulating layer and the gate insulating film and forming a bit line by depositing a doped first polysilicon layer and then patterning the doped first polysilicon layer;

c) depositing an etching protection layer over the exposed surface of the silicon substrate including the resulting structure formed in step b);

d) depositing on the etching protection layer a first and lowest roughened stacked oxide layer comprising a lower layer of PE TEOS and an upper layer of $O_3$/TEOS, and then depositing on the first roughened stacked oxide layer a doped second polysilicon layer, a second roughened stacked oxide layer, a doped third polysilicon layer, and a third and uppermost roughened stacked oxide layer, and annealing before the deposit of the doped second and third polysilicon layers;

e) forming a storage electrode contact hole by etching from the uppermost roughened stacked oxide layer to the surface of the drain or source region of the field effect transistor;

f) depositing a doped fourth polysilicon layer on the uppermost roughened stacked oxide layer and in the contact hole, and then forming a memory capacitor pattern by etching from the doped fourth polysilicon layer to a surface of the lowest roughened stacked oxide layer;

g) removing portions of the roughened stacked oxide layers to form a fin-shaped storage electrode of a memory capacitor;

h) forming a dielectric layer on the fin-shaped storage electrode and then depositing a doped fifth polysilicon layer on the dielectric layer as a plate electrode of a memory capacitor.

2. A method of fabricating a stacked memory capacitor of a DRAM cell according to claim 1, wherein said insulating layer is made of phosphosilicate glass (PSG).

3. A method of fabricating a stacked memory capacitor of a DRAM cell according to claim 1, wherein said etching protection layer is made of $Si_3N_4$.

4. A method of fabricating a stacked memory capacitor of a DRAM cell according to claim 1, wherein said dielectric layer is an ONO (Oxide-Nitride-Oxide) film formed by CVD.

5. A method of fabricating a stacked memory capacitor of a DRAM cell according to claim 1, wherein said dielectric layer is formed by a thermal oxidation of the doped polysilicon layer.

6. A method of fabricating a stacked memory capacitor of a DRAM cell comprising the steps of:
 a) forming a field effect transistor and an isolation region of field oxide in a surface of a silicon substrate, in which the field effect transistor further comprises a gate electrode, source and drain regions, and a gate insulating film interposed therebetween;
 b) depositing an insulating layer on the resulting structure formed in step a) and then forming a bit line contact hole, connected to the source or drain region of the field effect transistor by etching the insulating layer and the gate insulating film and forming a bit line by depositing a doped first polysilicon layer and then patterning the doped first polysilicon layer;
 c) depositing an etching protection layer over the exposed surface of the silicon substrate including the resulting structure formed in step b);
 d) depositing a roughened stacked oxide layer, comprising a lower layer of PE TEOS and an upper layer of $O_3$/TEOS on the etching protection on layer;
 e) forming a storage electrode contact hole, connected to the drain (or source) region of the field effect transistor, by etching the roughened stacked oxide layer, the etching protection layer, and the insulating layer;
 f) annealing the roughened stacked oxide layer and then depositing a doped second polysilicon layer on the roughened stacked oxide layer;
 g) forming a memory capacitor pattern by etching the doped polysilicon layer;
 h) removing a portion of the roughened stacked oxide layer to form a one fin storage electrode of a memory capacitor;
 i) forming a dielectric film on the one fin storage electrode, and then depositing a doped third polysilicon layer as a plate electrode of the memory capacitor.

7. A method of fabricating a stacked memory capacitor of a DRAM cell according to claim 6, wherein said insulating layer is made of phosphosilicate glass (PSG).

8. A method of fabricating a stacked memory capacitor of a DRAM cell according to claim 6, wherein said etching protection layer is made of $Si_3N_4$.

9. A method of fabricating a stacked memory capacitor of a DRAM cell according to claim 6, wherein said dielectric layer is an ONO (Oxide-Nitride-Oxide) film formed by CVD.

10. A method of fabricating a stacked memory capacitor of a DRAM cell according to claim 6, wherein said dielectric layer is formed by a thermal oxidation of the doped polysilicon layer.

* * * * *